(12) United States Patent
Alexandre et al.

(10) Patent No.: US 8,254,147 B2
(45) Date of Patent: Aug. 28, 2012

(54) BOX FOR AN ELECTRONICS MODULE FOR CONTROLLING A MACHINE

(75) Inventors: Renaud Alexandre, Montreuil en Touraine (FR); Marnix Van Der Mee, Montlouis sur Loire (FR); Anthony Batteau, la Chapelle aux Naux (FR)

(73) Assignee: Radiall, Rosny Sous Bois (FR)

( * ) Notice: Subject to any disclaimer, the term of this patent is extended or adjusted under 35 U.S.C. 154(b) by 243 days.

(21) Appl. No.: 12/619,078

(22) Filed: Nov. 16, 2009

(65) Prior Publication Data

US 2010/0142157 A1    Jun. 10, 2010

(30) Foreign Application Priority Data

Nov. 20, 2008   (FR) ...................................... 08 57883

(51) Int. Cl.
*H05K 5/02*      (2006.01)
(52) U.S. Cl. ..................................................... 361/813
(58) Field of Classification Search .................. 361/813, 361/818, 724, 725, 727, 730, 732
See application file for complete search history.

(56) References Cited

U.S. PATENT DOCUMENTS

| 4,716,722 A | 1/1988 | Rambach |
| 4,845,591 A | 7/1989 | Pavie |

FOREIGN PATENT DOCUMENTS

| EP | 0 213 019 A1 | 3/1987 |
| EP | 0 291 038 A1 | 11/1988 |
| FR | 2 881 607 A1 | 8/2006 |

OTHER PUBLICATIONS

Aug. 10, 2009 Search Report issued in French Application No. 0857883 (with translation).

*Primary Examiner* — Jeremy Norris
*Assistant Examiner* — Tremesha S Willis
(74) *Attorney, Agent, or Firm* — Oliff & Berridge, PLC

(57) ABSTRACT

A box for an electronics module for controlling a machine, in particular an engine, wherein the box comprises:
  a portion co-operating with at least one harness for connecting the box mechanically and electrically to the machine; and
  a bottom, two lateral sides, and a transverse side defining a housing for receiving the electronics module, and connector means of the electronics module.

14 Claims, 6 Drawing Sheets

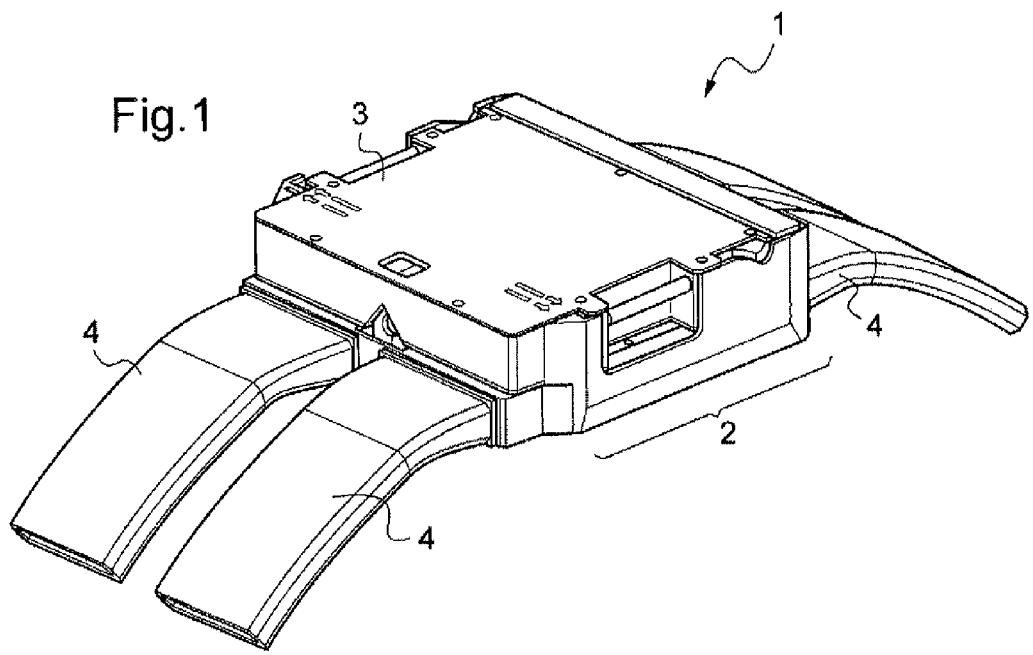
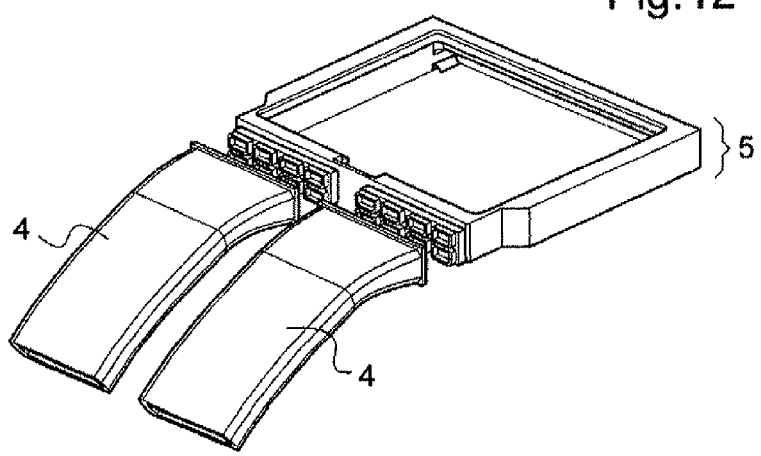

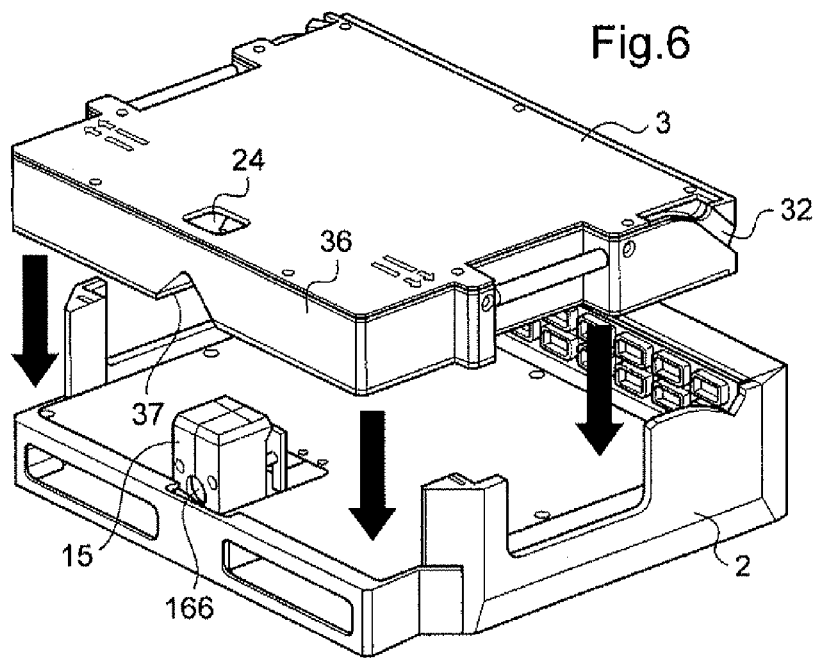
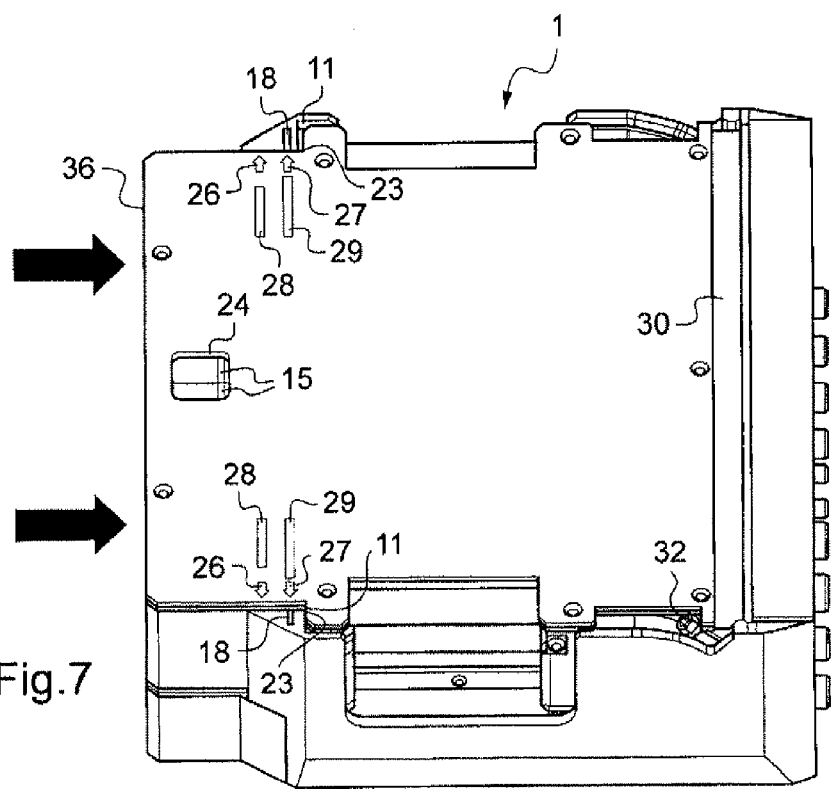

BOX FOR AN ELECTRONICS MODULE FOR CONTROLLING A MACHINE

FIELD OF THE INVENTION

The present invention relates to fastening an electronics control module on a machine, in particular on the casing of an engine.

The invention applies more particularly to aeroengines.

BACKGROUND OF THE INVENTION

It is known to fasten an electronics control module directly to the casing of a turbojet, and then to connect the electronics module to one or more harnesses via multiple circular connectors, which can make the operations of mounting and removing the electronics module during manufacture of the turbojet and/or for maintenance purposes relatively expensive in terms of time.

In known examples, it is also necessary to employ circular connectors that are distributed around the control module, thus requiring a large number of connectors and, by repeating elementary operations a large number of times, thereby multiplying the risk of error during operations of connecting the electronics module to the harness.

Applications EP 0 291 038, EP 0 213 019, and FR 2 881 607 disclose supports for receiving electronics modules for aircraft, those supports being fastened to a wall of the aircraft by means of screws.

OBJECT AND SUMMARY OF THE INVENTION

There exists a need to remedy the above-mentioned drawbacks, and certain exemplary embodiments the invention achieve this by means of a box for an electronics module for controlling a machine, in particular an engine, wherein the box comprises:
  a portion co-operating with at least one harness for connecting the box mechanically and electrically to the machine; and
  a bottom, two lateral sides, and a transverse side defining a housing for receiving the electronics module, and connector means for connecting with corresponding connector means of the electronics module.

Other exemplary embodiments of the invention also provide a box for an electronics module for controlling a machine, in particular an engine, the box being mechanically and electrically connected to the machine by at least one harness, and comprising:
  a bottom, two lateral sides, and a transverse side defining a housing for receiving the electronics module, and connector means for connecting with corresponding connector means of the electronics module; and
  at least one stud projecting into the housing, the stud having a portion that is stationary relative to the box and a portion that is movable relative to the box, in particular movable in translation.

Other exemplary embodiments of the invention provide a box for an electronics module for controlling a machine, in particular an engine, the box comprising:
  at least one portion co-operating with at least one harness for mechanically and electrically connecting the box to the machine; and
  a bottom, two lateral sides, and a transverse side defining a housing for receiving the electronics module, and connector means for connecting with corresponding connector means of the electronics module.

The portion co-operating with a harness may correspond to a bottom portion of the box. The bottom portion may include at least one housing for receiving at least one harness, the housing opening to the outside, for example.

The box may include a top portion having the bottom, the two lateral sides, and the transverse side defining the housing that receives the electronics module, and also the above-mentioned connector means.

In the invention, the engine-control electronics module is not fastened directly to the casing of the turbojet but is received in the housing that is formed in the top portion of the box, the box incorporating the harness(es) and connector means and acting as a docking station for the electronics module.

The term "box" should be understood as being synonymous with "receiver station". The box may be of any shape, there being no need for it to be rectangular, or square in shape, and it may be perforated, at least in part.

By means of the invention, installing and maintaining the electronics module requires no more than inserting and/or extracting the module into or from the housing formed in the top portion of the box.

The connector means of the box are advantageously carried by the transverse side of the top portion, thus enabling the bottom zone of the box to be reserved for receiving the harness(es) coming from the engine.

The box advantageously includes at least one stud projecting into the housing from the bottom of the top portion, the stud advantageously being arranged to enable the electronics module to be locked in the housing formed in the top portion of the box and to connect the electronics module to the box.

The box may be made of one or more pieces. By way of example, the stud may be assembled to the piece forming the bottom and the lateral sides of the top portion of the box.

The term "connecting the electronics module to the box" means putting the electronics module in a position in the housing formed in the top portion of the box such that the connection zone of the electronics module is coupled with the connection zone of the box.

The stud advantageously comprises a portion that is stationary relative to the box and a movable portion, in particular a portion that is movable relative to the box along a translation axis, the movable portion for example sliding in the stationary portion during the movement in translation of the electronics module in the housing formed in the top portion of the box.

The stationary portion of the stud advantageously includes a guide rail and the movable portion advantageously includes a transmission screw that is movable in rotation and a transmission slab that is movable in translation. By way of example, the user exerts a force on the transmission screw to tighten or loosen it, thereby causing the movable portion of the stud to move in the housing formed in the top portion of the box, the movable portion of the stud then exerting a force on the electronics module, causing it to be moved in said housing.

The use of a transmission screw thus advantageously enables the force exerted by the user to be multiplied in order to move the electronics module in the housing formed in the top portion of the box.

By way of example, the transmission screw is received at one of its ends in a bearing that is stationary in translation and movable in rotation relative to the box, and at its other end in a bearing that is constrained to move in translation with the transmission slab.

The movable portion of the stud advantageously includes a lock nut secured to the transmission screw, e.g. serving to exert the force required for disconnecting the electronics module from the box.

Also advantageously, the movable portion of the stud includes at least two needle thrust bearings, each thrust bearing being placed, for example, against the bearing that is constrained to move in translation with the transmission slab and bearing against the transmission screw. Such thrust bearings serve advantageously to reduce the friction forces between the transmission screw, said bearing, and the lock nut.

The transmission slab advantageously includes a face that is suitable for contacting the electronics module and including a sloping portion that slopes relative to the translation axis, such a sloping portion acting during movement of the transmission slab along the translation axis to exert a force on the electronics module that is collinear with the translation axis, for the purpose of connecting the electronics module to the box, and a force that is perpendicular to the translation axis, for the purpose of locking the electronics module on the box.

The transmission slab advantageously includes a visible indicator enabling an operator to detect that the electronics module is connected to the box, the visible indicator being arranged, for example, so as to be visible to an operator so long as the electronics module is not connected to the box.

The transmission slab advantageously includes a sliding portion having a wall that is mounted on one or more springs, the springs being limited-stroke springs, for example.

The sliding portion and the above-described sloping portion may define for example a single face of the transmission slab, being superposed, for example.

When the operator desires to extract the electronics module from the housing formed in the top portion of the box, the springs exert a force on the wall that can make it easier to disengage the electronics module by moving the electronics module away from the transmission slab, thereby preventing the electronics module becoming jammed by the transmission slab.

Furthermore, the springs of the sliding portion exert a force on the electronics module that enable the operator to observe the visible indicator carried by the transmission slab so long as the electronics module is not connected to the box.

The rating of the springs may then be selected so as to correspond to the tightening force needed for keeping the electronics module connected to the box. Because of the sliding portion of the invention, the disappearance of the visible indicator carried by the transmission slab can thus serve to guarantee that the necessary tightening force has been exerted on the electronics module.

The bottom of the top portion of the box is advantageously defined by a wall that is releasably fastened to the box, thus making it possible, by removing said wall, to gain access to the portion of the harness(es) engaged in the housing(s) formed in the bottom portion of the box.

The top portion of the box advantageously includes a flange extending at right angles towards the housing and formed at the top portion of the box at the top of the transverse side, thereby making it possible, while the turbojet is in use, for the connection zone of the box to be protected by the flange from dust or trickling water, and independently of the angle of inclination of the box on the casing. At least one of the lateral sides advantageously includes a recess extending over at least a fraction of the height of said side, the recess making it possible for example to receive the hands of the operator while the electronics module is being inserted in the housing formed in the top portion of the box, and without risking injury.

At least one of the lateral sides advantageously includes a setback extending over at least a fraction of the width of said sides.

At least one visible indicator is advantageously arranged on at least one of the lateral sides, in particular on the top of at least one of the lateral sides.

Other exemplary embodiments of the invention also provide an electronics module for controlling a machine and suitable for being received in a box as defined above, the module comprising:
 a reception zone for receiving at least one electronics card; and
 connector means for co-operating with the corresponding connector means of the box.

Other exemplary embodiments of the invention also provide an assembly comprising a box as defined above and an electronics module as defined above.

The assembly may include the harnesses serving to connect the box mechanically and electrically to the machine.

The connector means of the module are advantageously carried by a transverse face of the electronics module, thus making it possible to release space for the electronics cards that are to be installed in the electronics module, in contrast to locating the connector means centrally within the module. The transverse face corresponds for example to the length or to the width of the electronics module.

Advantageously, the electronics module has two lateral faces, with at least one of these two lateral faces defining grip means for grasping the electronics module.

The electronics module advantageously includes a cavity for co-operating with the above-defined box stud to constitute a system for locking the electronics module to the box. The stud and the cavity advantageously define keying means to ensure that the electronics module is in the proper operation relative to the box, and pre-centering means for pre-centering the electronics module in the housing formed in the top portion of the box.

At least one of the lateral faces of the electronics module is defined by a wall that advantageously includes a setback extending over at least a fraction of the width of said wall. This setback may, for example, come into abutment against a setback of a lateral side of the box.

The electronics module advantageously includes retractable means for locking it to the box, e.g. retractable bolts carried by the electronics module. Each bolt may be associated, for example, with a spring exerting a force urging the bolt into a retracted position when the electronics module is not connected to the box, thus preventing the bolt from projecting onto the box and giving rise to injuries.

The electronics module has a top face that advantageously includes at least one visible indicator. The visible indicator is advantageously constituted by at least one of the following:
 a visible indicator facing a lateral face and associated with the electronics module being in a position in the housing formed in the top portion of the box such that the electronics module is connected to the box;
 a visible indicator facing a lateral face and associated with the electronics module being in a position in said housing in which the electronics module is disconnected from the box; and
 a visible indicator extending at the margin of at least a portion of the transverse face.

The top face of the electronics module includes all three of the above-mentioned visible indicators, for example.

In a variant, a visible indicator associated with the electronics module being in the position in said housing in which it is disconnected from the box is placed facing each lateral face, and a visible indicator associated with the electronics module being in a position in said housing in which said electronics module is connected to the box is placed facing each lateral face, the top face of the electronics module thus having five visible indicators.

The invention also enables an operator to use one or more visible indicators in order to see whether the electronics module is indeed connected to the box.

Other exemplary embodiments of the invention also provide a method of fastening an electronics control module on the casing of a machine, in particular an engine, wherein the method comprises the steps consisting in:
- mechanically and electrically connecting the box as defined above to the casing of the machine with the help of at least one harness;
- inserting an electronics module into the housing formed in the top portion of the box; and
- connecting the electronics module to the box.

Inserting the electronics module into the housing formed in the top portion of the box may comprise the following steps:
- bringing the electronics module into abutment against the bottom of the top portion of the box; and
- moving the electronics module parallel to the lateral sides of said housing until the connection zone of the electronics module is coupled to the connection zone of the box.

The method may also include a subsequent step consisting in locking the electronics module to the box by retractable locking means for locking the electronics module to the box.

The invention thus makes it possible to reduce the number of manipulations required for fastening the electronics module to the casing, it being possible for only two movements in translation to suffice for that purpose.

BRIEF DESCRIPTION OF THE DRAWINGS

Other advantages and characteristics of the invention appear on reading the following description of a non-limiting embodiment given with reference to the accompanying drawings, in which:

FIG. 1 is a perspective view of an assembly comprising a box of the invention;

FIGS. 6 to 10 show various steps while locking and connecting the electronics module to the box;

FIG. 12 shows an embodiment of the invention using break connectors.

MORE DETAILED DESCRIPTION

Figure 2:
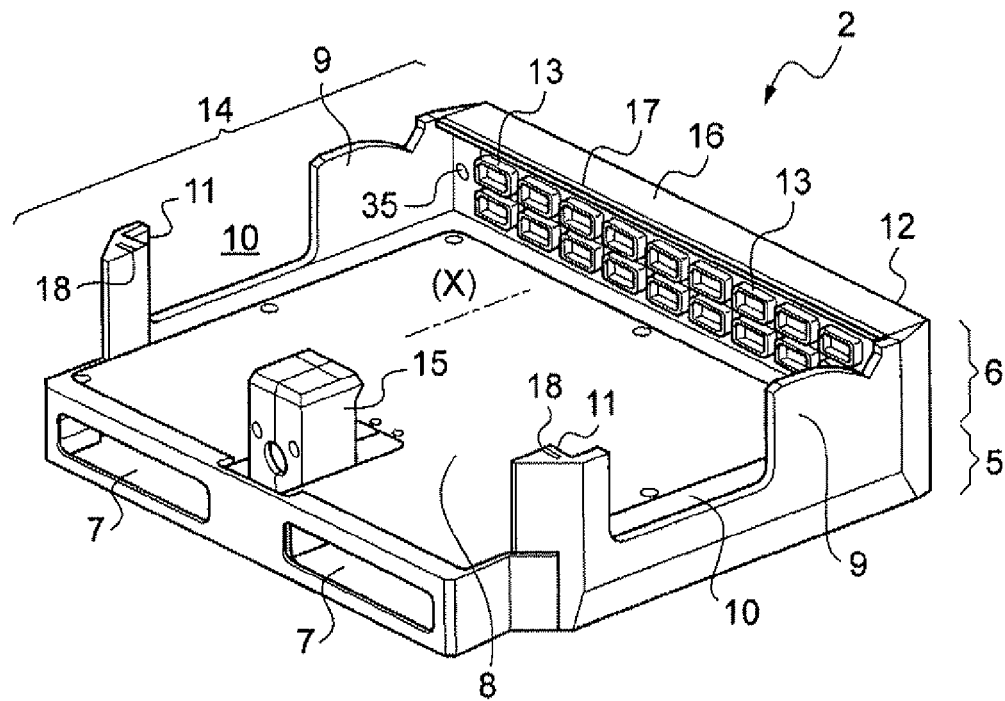
FIG. 2 is a perspective view of the box of the invention.

FIG. 1 shows an assembly of the invention given overall reference 1.

The assembly 1 comprises a box given overall reference 2, that serves to receive an electronics module for controlling an engine, e.g. a turbojet, the module being given overall reference 3.

As can be seen, the assembly 1 is mounted on the casing of the turbojet by means of four harnesses 4. The harnesses 4 serve to connect the assembly 1 electrically to the turbojet via electric cables or ribbon cables (not shown).

FIG. 2 shows an example box 2 on its own. The box 2 is made of an aluminum alloy, for example.

As can be seen, the box 2 may comprise a bottom portion 5 and a top portion 6. In the example described, the bottom portion 5 defines four housings 7 each for receiving one of the harnesses 4.

In a variant shown in FIG. 12, the harnesses 4 are connected to the box 2 via break connectors, e.g. made by using EN4644 type connectors that make it possible advantageously to remove the box from the casing without taking action on the engine harnesses.

The top portion 6 comprises a bottom 8 defined by a wall removably mounted on the box, e.g. by means of screws. Removing this wall makes it possible, where appropriate, to access the portions of the harnesses 4 that are received in one of the housings 7.

The top portion 6 also has two lateral sides 9 each including a recess 10 occupying a fraction of the height of the side 9. In the example described, each lateral side 9 also has a setback 11 extending over a fraction of the width of the side 9 for a function that is described below. These lateral sides 9 extend along an axis X along which the electronics module 3 that is suitable for being fastened to the box 2 can be moved in translation relative to the box, as described below.

The top portion 6 also has a transverse side 12 interconnecting the two lateral sides 9 and having a plurality of connectors 13, which connectors define a connection zone.

The transverse size 12 also has two nuts 35, each nut 35 being disposed on a respective side of the connection zone. Each nut 35 extends along an axis that is oblique relative to the transverse side 12.

In the example described, the bottom 8, the lateral sides 9, and the transverse side 12 define a housing 14 of generally rectangular shape.

The box 2 also has a stud 15 projecting into the housing 14 from the bottom 8. By way of example, the stud is fitted to the remainder of the box, which may itself comprise a single piece.

Figure 4:
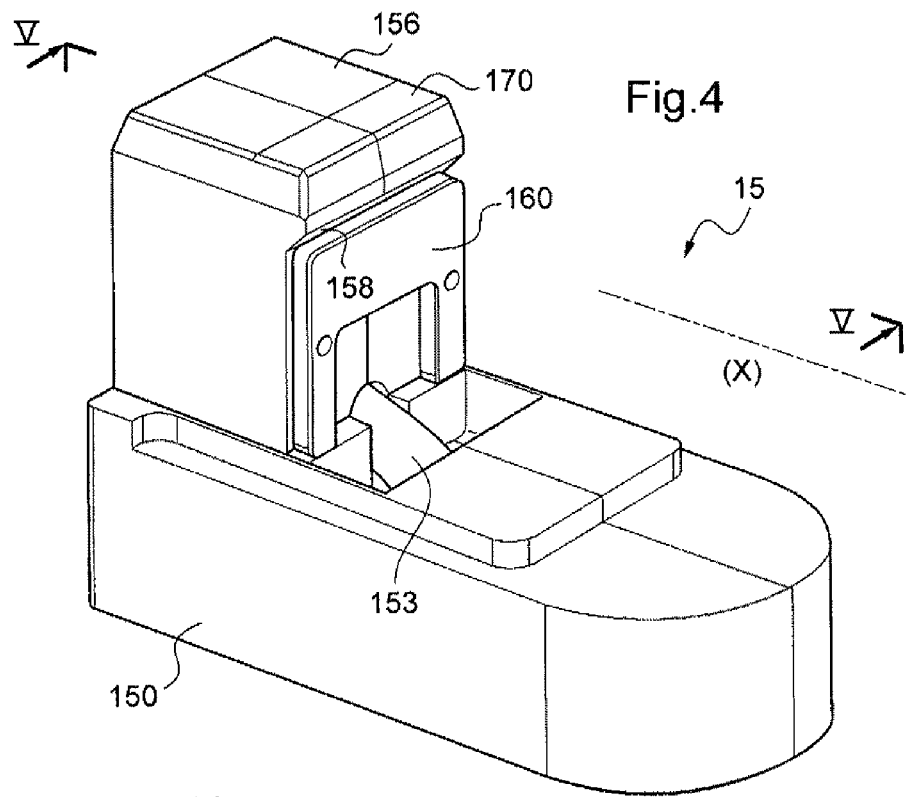
FIG. 4 is a perspective view of an example of a stud of the invention.

FIG. 4 shows an example of the stud 15 of the invention. The stud 15 comprises a stationary portion 150 that, in the example described, is defined by a guide rail in the form of two half-shells fastened in the bottom portion 5 of the box 2.

Figure 5:
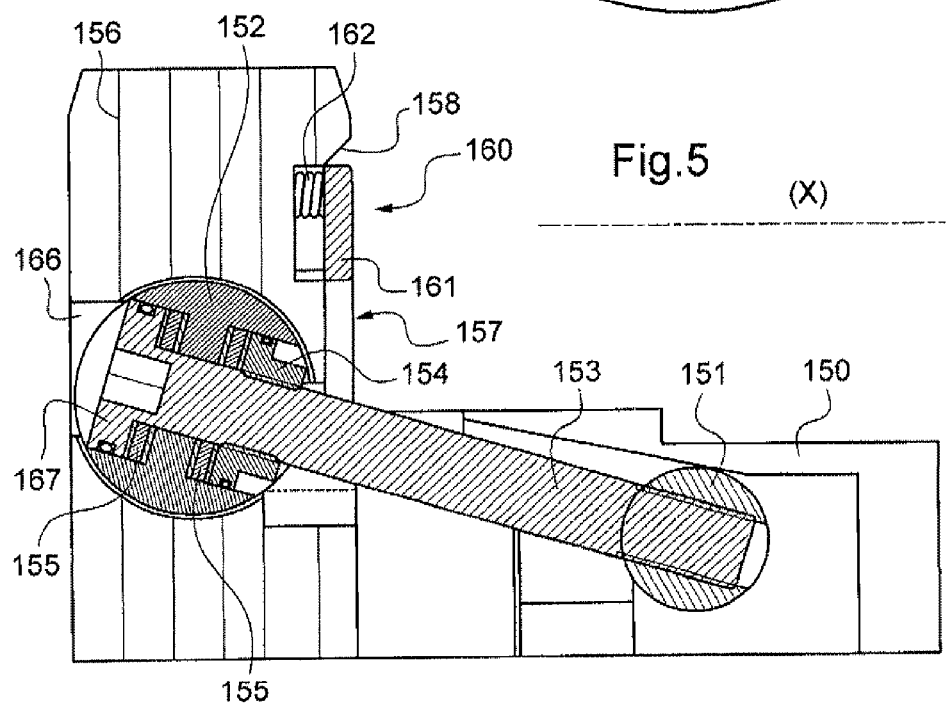
FIG. 5 is a section view on V-V of the FIG. 4 stud.

The stud 15 also has a movable portion that, as can be seen in FIG. 5, comprises two cylindrical bearings 151 and 152, a transmission screw 153, a lock nut 154 secured to the transmission screw 153, two needle thrust bearings 155, and a transmission slab 156. An opening 166 is provided in the transmission slab 156 and is open to the head 167 of the transmission screw 153.

In the example described, the cylindrical bearing 151 is stationary in translation and movable in rotation relative to the box 2, and it includes tapping to receive the transmission screw 153 as it moves.

The cylindrical bearing 152 is received in the transmission slab 156 and it is movable both in rotation and in translation relative to the box 2.

The needle thrust bearings 155 are disposed against the transmission screw 153, on either side of the bearing 152.

The lock nut 154 is secured to the transmission screw 153, as can be seen in FIG. 5.

By way of example, the transmission slab 156 is made up of two half-shells and presents a face 157 suitable for coming into contact with the electronics module 3 when it is received in the housing 14, and including a sliding portion 160 and a sloping portion 158 that slopes relative to the axis X.

As shown in FIG. 5, the sliding portion 160 has a wall 161 against which springs 162 exert a force. By way of example, the springs 162 are limited-stroke springs.

The stud 15 also includes a visible indicator 170, e.g. in the form of a colored mark, as can be seen in FIG. 4.

As can be seen in FIG. 2, the transverse side 12 is surmounted by a right-angled flange 16 extending towards the housing 14. In the example described, a longitudinal groove 17 is formed along the entire length of the transverse size.

A visible indicator 18 is provided on top of each lateral side 9. By way of example, this visible indicator is made by providing a notch in the top of each lateral side. In a variant, a colored patch is stuck or painted onto the top of each lateral side 9 to form the visible indicator.

Figure 3:
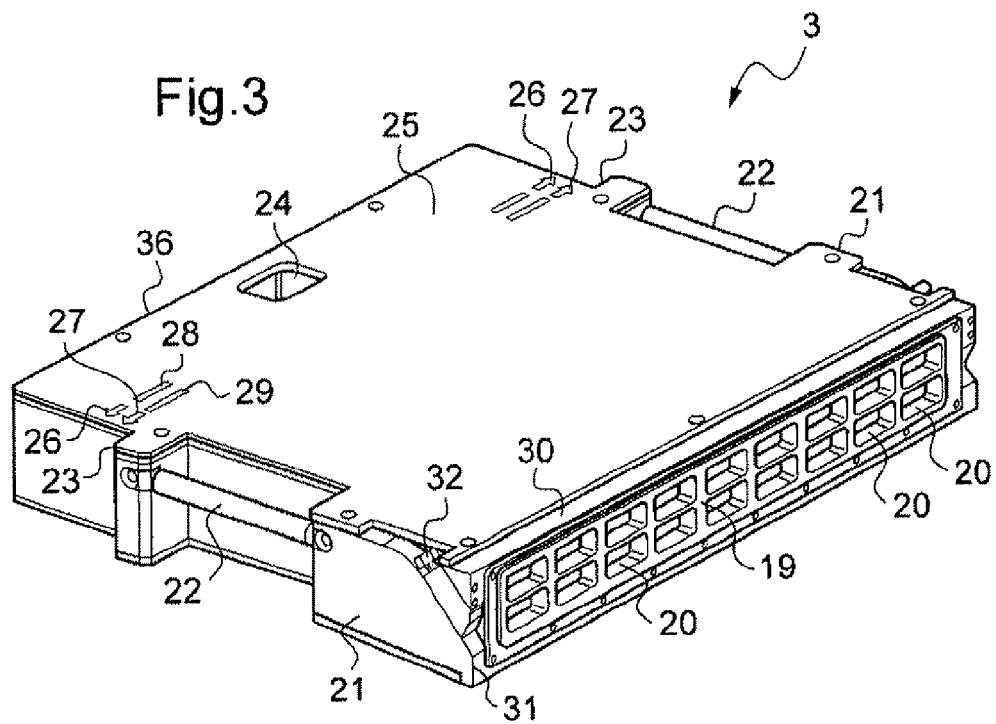
FIG. 3 is a perspective view of an electronics module of the invention.

With reference to FIG. 3, there follows a description of an example of an electronics module 3 of the invention.

As can be seen, the electronics module 3 is generally in the form of a rectangular block. The electronics module 3 includes internally a reception zone (not visible in the figure) for receiving a plurality of electronics cards.

The electronics module 3 presents a transverse face 19 having a plurality of connectors 20 defining a connection zone, these connectors being arranged to couple with the connectors 13 of the box.

In the example described, the connectors 13 of the box 2 are male connectors and the connectors 20 of the electronics module 3 are female connectors, however it would not go beyond the ambit of the present invention for the male connectors to be carried by the electronics module 3 and the female connectors to be carried by the box 2.

The electronics module 3 presents two lateral faces 21, each including a rod 22 extending over a fraction of the length of a face 21, the rod 22 advantageously constituting grip means for grasping the electronics module 3.

As can be seen in FIG. 3, the lateral faces 21 are defined by respective walls each including a setback 23 extending over a fraction of the width of said wall for a function that is described below.

In the example described, a through cavity 24 is provided through the entire height of the electronics module 3.

The electronics module 3 also presents a top face 25 into which the through cavity 24 opens and that includes visible indicators 26 and 27 provided facing each of the lateral faces 21. Each visual indicator 26 is associated with a zone of text 28 bearing the mention "disconnected" and each visible indicator 27 is associated with a zone of text 29 bearing the mention "connected".

The invention is not limited to the presence of a visible indicator 26 or 27 facing each of the lateral faces 21. In a variant, the top face 25 could have only one visible indicator 26 and only one visible indicator 27.

In the example described, the top face 25 also includes a visible indicator 30 extending over the entire length of the top face 25 beside the transverse face 19. By way of example, this visible indicator 30 is made using a colored strip that is stuck or painted onto the top face 25.

The top face 25, and where appropriate, the bottom face of the electronics module 3 are defined, for example, by removable walls so as to give access to the electronics cards housed inside the electronics module 3.

As can be seen in FIG. 6, the electronics module also includes a rear face 36 opposite from the transverse face 19 that defines the connection zone. In the example described, a notch 37 is formed in the middle portion of this rear face 36 occupying less of the height of the rear face 36. The notch 37 communicates with the through cavity 24, for example.

The electronics module 3 also includes at one end 31 of each lateral face 21 retractable locking means 32 for engaging the box 2, and constituted in the example described by a retractable bolt associated with a spring 33.

There follows a description of an example of fastening an assembly 1 of the invention on the casing of a turbojet.

The box 2 is initially permanently fastened onto the casing of the turbojet and it is mechanically and electrically connected to the casing by means of the harnesses 4 that are inserted in the housings 7. During this step, the electrical cables of the harnesses are connected to the connection zone of the box. In a variant, the box 2 is fastened on the casing with the help of the above-described break connectors.

As shown in FIG. 6, the electronics module 3 is initially moved in translation perpendicularly to the bottom 8 of the top portion 6 of the box 2 until the electronics module 3 comes into abutment against said bottom 8. During this movement in translation, the stud 15 penetrates into the through cavity 24, thereby constituting keying means to ensure that the electronics module 3 is properly oriented relative to the box 2 and to ensure that the electronics module 3 is pre-centered in the housing 14.

At the end of this step, as shown in FIG. 7, the corresponding setbacks 23 and 11 of the electronics module 3 and of the box 2 face one another, so as to constitute a thrust bearing for movement of the electronics module 3 in the housing 14, e.g. preventing the electronics module from escaping from the housing 14 when the box is inclined.

During a following step, the electronics module 3 is moved in translation by the user along the axis X, i.e. parallel to the lateral side 9 of the top portion 6 of the box 2, which side advantageously constitutes means for guiding the electronics module 3.

To connect the electronics module 3 to the box 2, the user exerts a screw-tightening force on the transmission screw 153 through the notch 37 formed in the electronics module 3 and the opening 166 formed in the transmission slab 156, thereby moving the transmission slab 156 in translation and causing the slab 156 to exert a force on the electronics module 3 parallel to the axis X.

Figure 8:
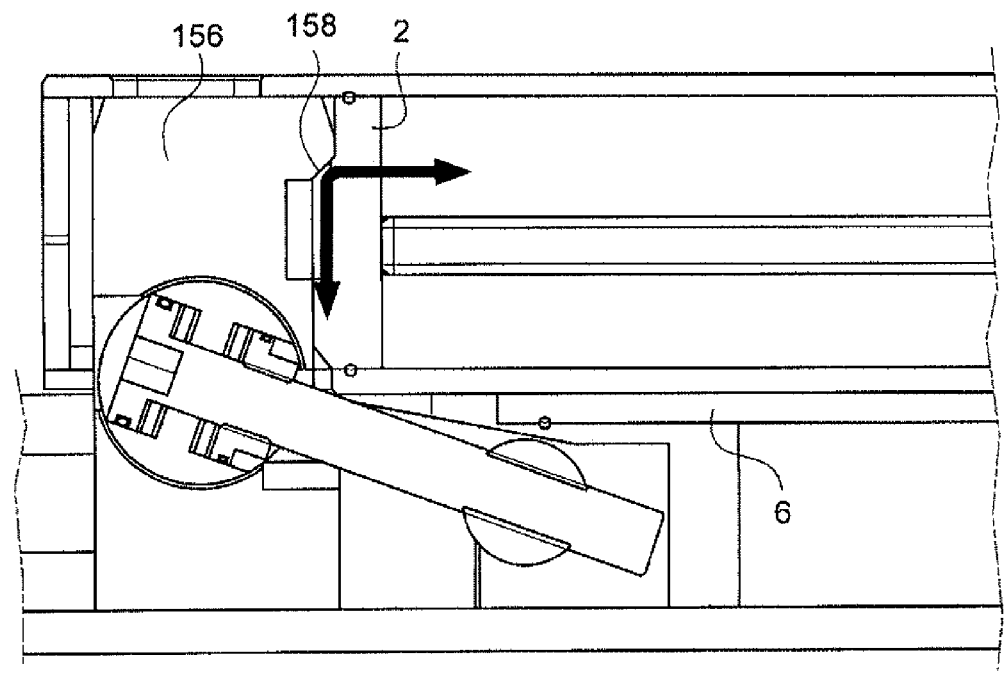

FIG. 8 shows in greater detail the interaction between the stud 15 and the electronics module 3 while the module is being moved in translation in the housing 14.

While the user is tightening the transmission screw 153, the ends of the screw received in the bearing 151 and in the bearing 152 are caused to move in translation.

The presence of the needle thrust bearing 155 serves to limit friction phenomena between the transmission screw 153, the bearing 152, and the lock nut 154.

Movement of the bearing 152 in translation causes the transmission slab 156 to move in translation in the housing 14, with the transmission slab 156 then acting via the sloping portion 158 to exert a force on the walls of the through cavity 24 formed in the electronics module 3.

As can be seen in FIG. 8, the force exerted by the sloping portion may be resolved into two forces: a force collinear with the axis X and causing the electronics module 3 to move towards the connection zone 13 of the box 2; and a force perpendicular to the axis X serving to lock the electronics module 3 to the box 2.

Figure 9:
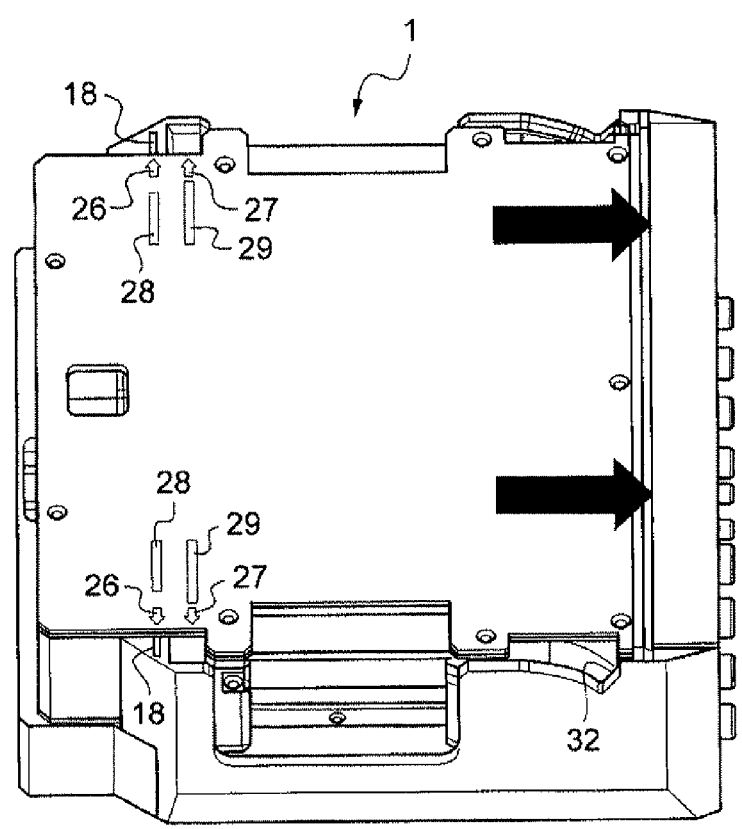

The movement in translation is continued until the transverse face 19 of the electronics module 3 rests against the transverse side 12 of the box 2, as shown in FIG. 9, thereby causing the connectors 13 of the box 2 to couple with the connectors 20 of the electronics module 3.

The visible indicators 26, 27, and 30 of the electronics module 3 are arranged in such a manner that when the electronics module 3 is in a position in the housing 14 in which the electronics module 3 is not connected to the box 2, as shown in FIG. 7, the visible indicator 30 can be seen by the operator, and the visible indicators 18 that are formed on the top of each lateral side 9 of the box 2 face the visible indicators 26 of the electronics module 3 that are associated with the mention "disconnected".

When the electronics module 3 is in a position in the housing 14 in which the electronics module 3 is connected to the box 2, as shown in FIG. 9, then the visible indicator 30 can no longer be seen and the visible indicators 18 face the visible indicators 26 associated with the mention "connected".

Furthermore, when the electronics module 3 is in the housing 14 in the position shown in FIG. 9, the visible indicator 170 formed on the stud 150 is no longer visible, whereas it is visible when the electronics module 3 is in the housing 14 in the position shown in FIG. 7.

Figure 10:
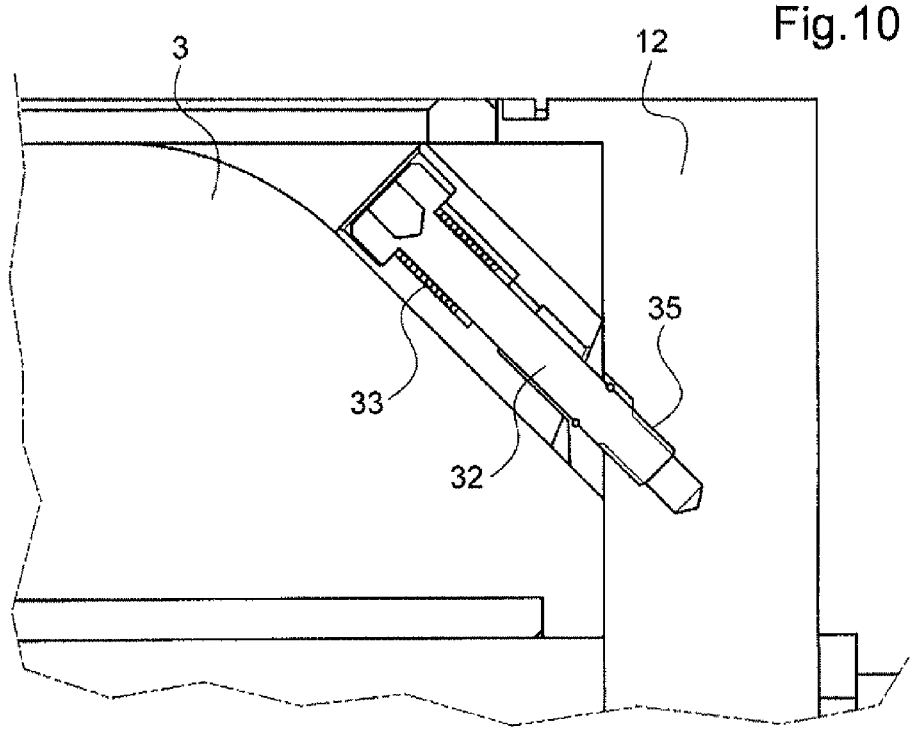

At the end of this step, and as shown in FIG. 10, the operator can complete locking of the electronics module 3 to the box 2 by means of the retractable bolts 32. The bolts 32 are received in the nuts 35 disposed on either side of the connection zone 13.

The invention also facilitates the operations of extracting the electronics module 3.

Thus, when disconnecting the electronics module 3 from the box, the operator may unscrew the transmission screw 153, thereby causing the movable portion of the stud 15 to move, and in a manner similar to that described above, causing the moving portion of the stud to exert a force on the electronics module 3 so as do move it.

In addition, when the electronics module 3 has been disconnected from the box 2 and is in the housing 14 back in a position analogous to that shown in FIG. 7, the electronics module 3 might be bearing against the transmission slab 156 as a result of its weight and the possibility of the box 2 being inclined, which could make it difficult to extract the electronics module 3 from the housing 14.

Figure 11:
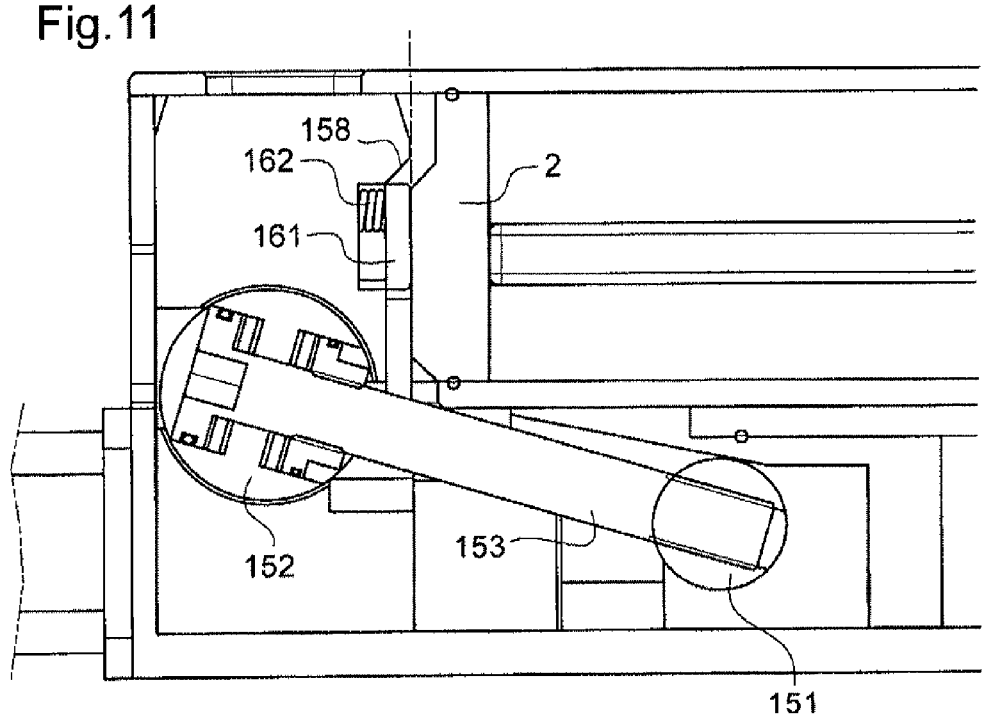
FIG. 11 shows a step while extracting the electronics module from the box.

As shown in FIG. 11, by means of the invention, the springs 162 of the sliding portion 160 exert a force on the electronics module 3 moving it away from the transmission slab 156.

The invention is not limited to an electronics module that is generally in the shape of a rectangular block.

The invention is not limited to controlling engines, but could be used for any other management function or any other electronic equipment rack function.

What is claimed is:

1. A box for an electronics control module for controlling a machine, in particular an engine, the box comprising:
   a bottom portion including at least one housing, the at least one housing being open to an outside of the bottom portion to receive at least one harness connecting the box mechanically and electrically to the machine; and
   a top portion comprising a bottom, two lateral sides extending along a translation axis, and a transverse side connecting the two lateral sides defining a main housing for receiving the electronics control module, the transverse side comprising connector means configured for connecting with corresponding connector means of the electronics control module, wherein
   the box includes at least one stud projecting into the main housing, which is formed in the top portion of the box, from the bottom of the top portion, the stud being configured to be received in a cavity formed in the electronics control module.

2. A box according to claim 1, wherein the stud comprises a stationary portion that is stationary relative to the box and a movable portion that is movable along the translation axis relative to the box, the movable portion being moved by a transmission screw operated by a user so as to cause transmission of the electronics control module along said translation axis and coupling the connector means of the electronics control module with a connector means of the bottom portion.

3. A box according to claim 2, wherein the movable portion of the stud comprises a transmission slab that is movable in translation, and wherein the transmission screw is received at one of its ends in a bearing that is stationary in translation and movable in rotation relative to the box, and at its other end in a bearing that is constrained to move in translation with the transmission slab.

4. A box according to claim 3, wherein the transmission slab includes a face suitable for containing the electronics control module, the transmission slab having a sloping portion that slopes relative to the translation axis, and wherein the transmission slab includes a sliding portion having a wall mounted on at least one spring.

5. A box according to claim 1, wherein the top portion includes a flange extending at right angles towards the main housing formed in the top portion of the box, at a top of the transverse side.

6. A box according to claim 1, wherein at least one of the lateral sides includes a recess extending over at least a fraction of a height of said at least one lateral side, and wherein at least one of the lateral sides includes a setback extending over at least a fraction of a width of said at least one lateral side.

7. A box according to claim 1, wherein at least one visible indicator is provided on at least one of the lateral sides.

8. An assembly comprising:
   the box according to claim 1; and
   an electronics control module suitable for being received in said box, the electronics control module comprising:
      a reception zone for receiving at least one electronics card; and
      connector means for co-operating with a corresponding connector means of the box.

9. An assembly according to claim 8, wherein the connector means of the box are carried by the transverse side of the box, and wherein the connector means of the electronics control module are carried by a transverse face of the electronics control module.

10. An assembly according to claim 8, wherein the electronics control module includes two lateral faces, at least one of the lateral faces defining grip means for grasping the electronics control module.

11. An assembly according to claim 8, wherein the electronics control module includes a cavity designed to co-operate with the stud of the box.

12. An assembly according to claim 8, wherein at least one of the lateral faces of the electronics control module is defined by a wall including a setback extending over at least a fraction of a width of said wall.

13. An assembly according to claim 8, wherein the electronics control module includes retractable fastenable means for engaging the box.

14. An assembly according to claim 8, wherein the electronics control module has a top face including at least one of the following:
   a visible indicator associated with the electronics control module when the electronics control module occupies a position in the main housing formed in the top portion of the box in which the electronics control module is connected to the box;
   a visible indicator associated with the electronics control module when the electronics control module occupies a position in said main housing in which the electronics control module is disconnected from the box; and
   a visible indicator extending at the margin of at least a portion of a transverse face.

* * * * *